(12) United States Patent
Watanabe (10) Patent No.: US 7,042,031 B2
(45) Date of Patent: May 9, 2006

(54) SOLID-STATE IMAGING DEVICE AND METHOD FOR DRIVING THE SAME

(75) Inventor: Takashi Watanabe, Soraku-gun (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/776,935

(22) Filed: Feb. 10, 2004

(65) Prior Publication Data

US 2004/0201046 A1    Oct. 14, 2004

(30) Foreign Application Priority Data

Feb. 10, 2003 (JP) .............................. 2003-032847

(51) Int. Cl.
*H01L 31/062* (2006.01)

(52) U.S. Cl. ...................................... 257/292; 257/291
(58) Field of Classification Search ............ 257/80–85, 257/292, 291, 294
See application file for complete search history.

(56) References Cited

U.S. PATENT DOCUMENTS 6,504,194 B1* 1/2003 Miida .......................... 257/292

* cited by examiner

*Primary Examiner*—Hung Vu
(74) *Attorney, Agent, or Firm*—David G. Conlin; William J. Daley, Jr.; Edwards, Angell, Palmer & Dodge (57) ABSTRACT

A solid-state imaging device includes at least one pixel section; and a control section for controlling an operation of the at least one pixel section. The at least one pixel section includes a light receiving section for outputting charges by performing photo-electric conversion of light incident thereon, and a transistor section having a charge accumulation region for accumulating the charges output by the light receiving section. The transistor section outputs an output signal representing a voltage value corresponding to an amount of charges accumulated in the charge accumulation region. The control section, for resetting the charges accumulated in the charge accumulation region after the output signal is output from the transistor section, injects the charges into the charge accumulation region before discharging the accumulated charges from the charge accumulation region.

29 Claims, 8 Drawing Sheets

SOLID-STATE IMAGING DEVICE AND
METHOD FOR DRIVING THE SAME

This non-provisional application claims priority under 35 U.S.C., §119(a), on Patent Application No. 2003-032847 filed in Japan on Feb. 10, 2003, the entire contents of which are hereby incorporated by reference.

BACKGROUND OF THE INVENTION

1. Field of the Invention

The present invention relates to a solid-state imaging device, for example, a threshold voltage modulation system MOS image sensor, and a method for driving the same.

2. Description of the Related Art

An amplification type solid-state imaging device is nowadays widely used as a solid-state imaging device, in which each of unit pixels has a signal amplification function and signals are sequentially read from each unit pixel by a scanning circuit. Such an amplification type solid-state imaging device is available in a planar type and a vertical type. In a planar type amplification type solid-state imaging device, elements including a reset section and a pixel selection section are arranged in a planar manner in each unit pixel. In a vertical type amplification type solid-state imaging device, such elements are arranged vertically.

For example, Japanese Laid-Open Publications Nos. 11-195778 and 2002-134729 propose a vertical type amplification type solid-state imaging device which is called a threshold voltage modulation system MOS image sensor. This image sensor includes a MOS transistor (insulation gate type field effect transistor) for detecting a signal corresponding to an amount of light and a carrier pocket (charge accumulation region) provided below a channel region of the MOS transistor.

A threshold voltage modulation system MOS image sensor (also referred to simply as "MOS image sensor" or "image sensor") will be described in detail with reference to FIGS. 6A and 6B.

Figure 6A:
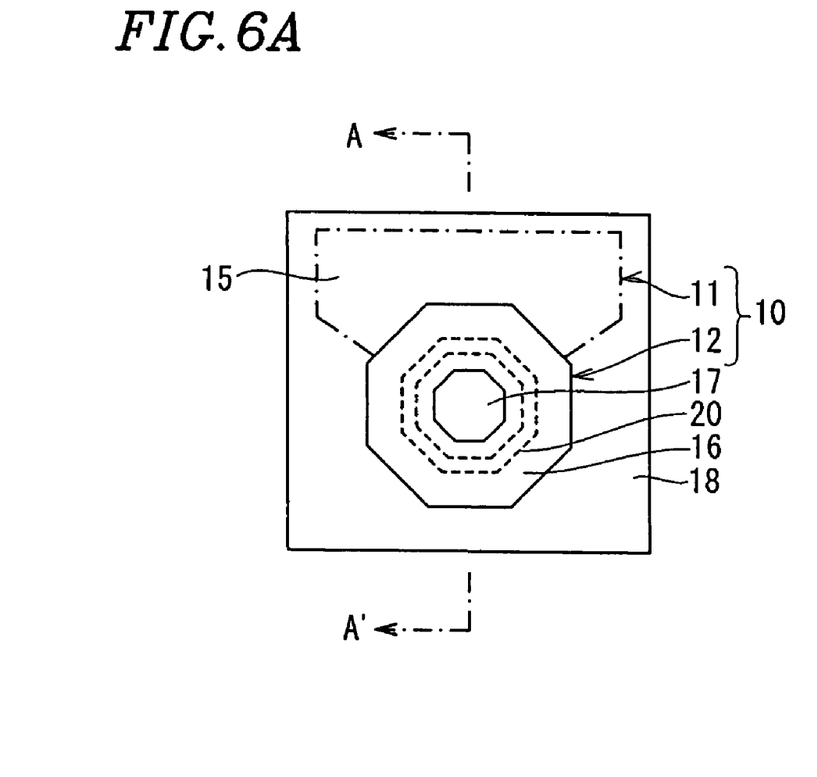
FIG. 6A is a block diagram illustrating a solid-state imaging device.
Figure 6B:
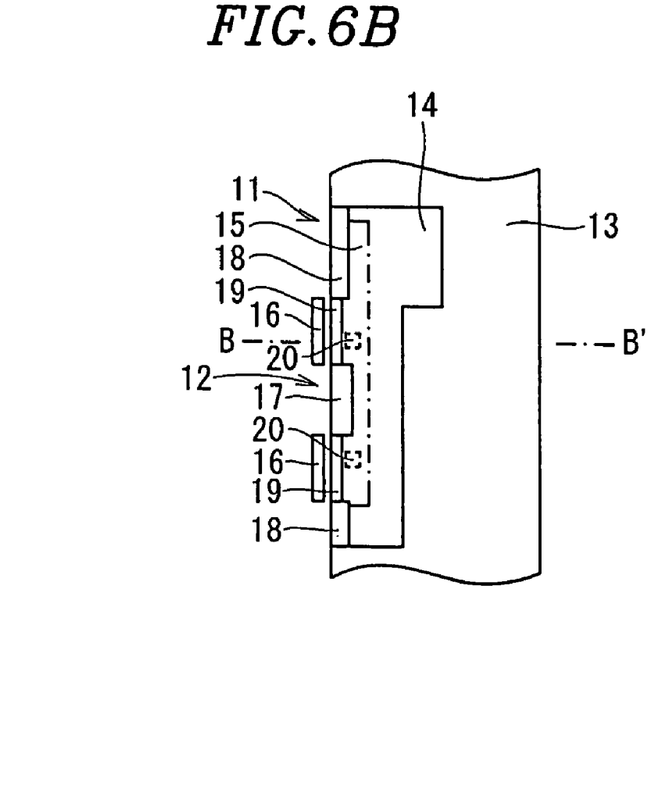
FIG. 6B is a cross-sectional view of the solid-state imaging device shown in FIG. 6A.

FIGS. 6A and 6B show a part of the threshold voltage modulation system MOS image sensor. FIG. 6A is a top view of a unit pixel section 10, which corresponds to one pixel of the image sensor. FIG. 6B is a cross-sectional view of the unit pixel section 10 taken along line A–A' in FIG. 6A. The image sensor includes a plurality of unit pixel sections 10.

Referring to FIGS. 6A and 6B, each unit pixel section 10 includes a light receiving diode 11 for performing photoelectric conversion of light incident thereon to generate charges in an amount corresponding to the amount of incident light, and a MOS transistor 12 for detecting a signal corresponding to the amount of incident light. The MOS transistor 12 is adjacent to the light receiving diode 11.

The light receiving diode 11 includes an N-type well region 14 formed in a surface region of a P-type substrate 13, and a P-type well region 15 formed on the N-type well region 14. An area of the P-type well region 15, which is in the light receiving diode 11, acts as a light receiving region and generates charges (holes) when irradiated with light. The P-type well region 15 connects the light receiving diode 11 and the MOS transistor 12 to each other.

The MOS transistor 12 includes an annular gate electrode 16, an N-type source region 17 surrounded by the gate electrode 16, an N-type drain region 18 provided outside the gate electrode 16, an N-type layer 19 acting as a transistor channel region, and a P-type carrier pocket region 20 acting as a charge accumulation region. The P-type carrier pocket region 20 is a p-type hole pocket region in this example.

The gate electrode 16 is provided so as to surround the source region 17. The source region 17 is provided inside the gate electrode 16. The drain region 18 is provided so as to surround the annular gate electrode 16.

The N-type layer 19 is provided right below the gate electrode 16 as a transistor channel region between the source region 17 and the drain region 18.

The carrier pocket region 20 is provided at a position which is in the P-type well region 15, below the gate electrode 16 and the N-type layer 19, and in the vicinity of the source region 17. Horizontally seen (FIG. 6A), the carrier pocket 20 is annular and surrounds the source region 17. Charges generated in the light receiving diode 11 are accumulated in the carrier pocket region 20 through the P-type well region 15. For a signal read operation, a prescribed unit pixel section 10 is selected by a gate voltage applied to the gate electrode 16, and an output signal (imaging signal) representing a voltage value corresponding to the amount of the charges accumulated in the carrier pocket region 20 is output from the source region 17. For a reset operation, the charges accumulated in the carrier pocket region 20 are discharged toward the substrate 13 from the carrier pocket region 20 through the drain region 18 by a gate voltage applied to the gate electrode 16.

The MOS image sensor includes a plurality of unit pixel sections 10 in a matrix, i.e., in rows and columns. Gate voltages of a selected row and gate voltages of an unselected row are separately controlled by a gate driving circuit (not shown), so that image signals for respective selected unit pixel sections 10 are sequentially read through a selected column.

The operation of the MOS image sensor will be described with reference to FIGS. 7 and 8.

Figure 7:
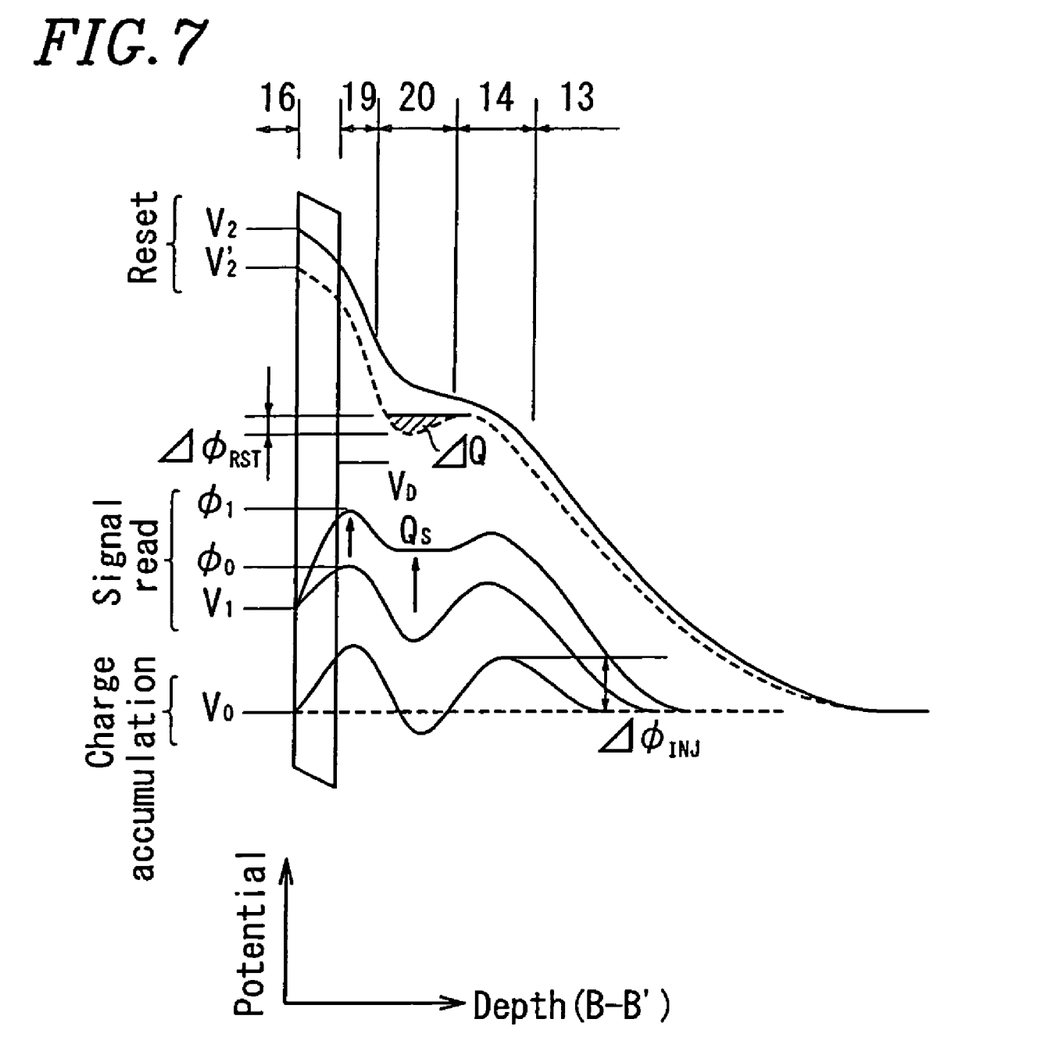
FIG. 7 shows a potential distribution of the unit pixel section shown in FIG. 6A.

FIG. 7 shows a potential distribution of the unit pixel section 10 shown in FIGS. 6A and 6B in operation (during an imaging cycle). In FIG. 7, the horizontal axis represents the depth of the MOS image sensor from the surface of a cross-section taken along line B–B' in FIG. 6B. In accordance with the depth, the MOS image sensor includes the gate electrode 16, the N-type layer 19 as the channel region, the carrier pocket region 20, the N-type well region 14, and the substrate 13. The vertical axis represents the potential in each of the regions of the MOS image sensor during operations in the imaging cycle. One imaging cycle includes a charge accumulation operation, a signal read operation and a reset operation.

As shown in FIG. 7, for the charge accumulation operation, the potential of the gate electrode 16 (gate voltage) is set to $V_0$, and the charges (holes) are transferred from the light receiving diode 11 to the carrier pocket region 20 and accumulated. The concentration profile of each region is set such that the potential barrier $\Delta\phi_{INJ}$ related to the transfer of the holes from the substrate 13 to the carrier pocket region 20 has a magnitude such that charges are not injected from the substrate 13 into the carrier pocket region 20.

Next, for the signal read operation, the potential of the gate electrode 16 is set to $V_1$, and the potential of the drain voltage region 18 is set to $V_D$. Thus, the potential of the N-type layer 19 as the channel region changes in accordance with the amount of the accumulated charges in the carrier pocket region 20. (For example, the potential of the N-type layer 19 becomes $\phi_0$ when the amount of the accumulated charges is 0, and the potential of the N-type layer 19 becomes $\phi_1$ when the amount of the accumulated charges is Qs). Such a change in the potential of the N-type layer 19 is read from the source region 17 as an output signal (hereinafter, referred to as an "S signal") corresponding to the amount of the accumulated charges in the unit pixel section 10.

When the signal read operation is terminated, the potential of the gate electrode 16 is set to $V_2$, which is high. This starts the reset operation of discharging the charges accumulated in the carrier pocket region 20 toward the substrate 13. After the reset operation, the potential of the gate electrode 16 is again set to $V_1$, and a pixel reference signal (hereinafter, referred to as an "N signal") is read from the source electrode 17 in a reset state. After the N signal is read, the operation of the MOS image sensor is returned to the charge accumulation operation (the potential of the gate electrode 16 is set to $V_0$). Then, the next imaging cycle is performed. The imaging cycle is repeated in this manner.

Figures 8A, 8B:
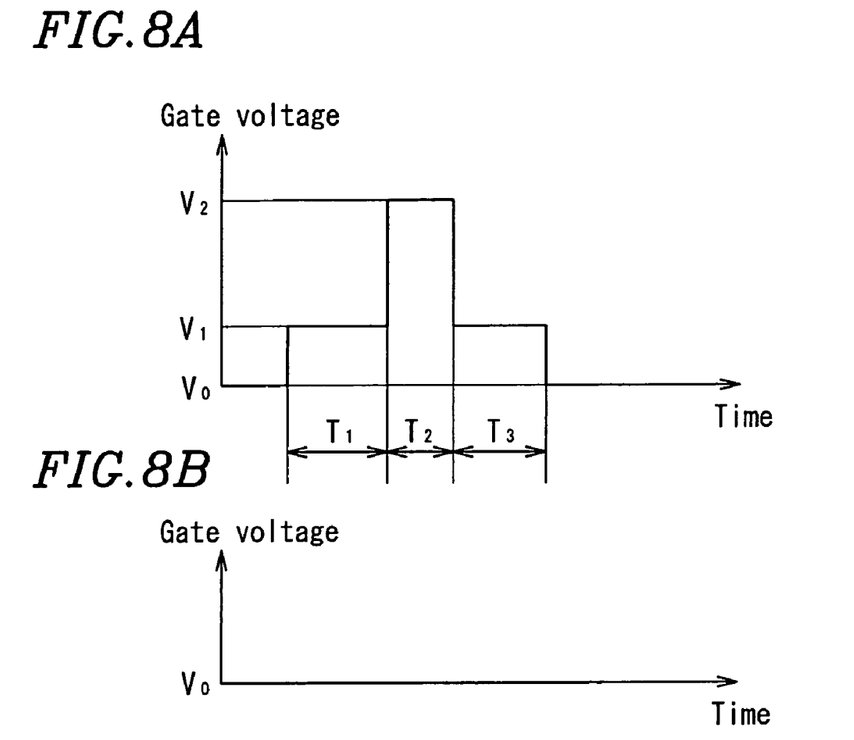
FIGS. 8A and 8B are timing diagrams illustrating the gate voltage in the solid-state imaging device shown in FIG. 6A.

FIGS. 8A and 8B are timing diagrams illustrating the gate voltage of each operation (charge accumulation operation, signal read operation, and reset operation) during the imaging cycle. FIG. 8A shows a change in the gate voltage of a selected row, and FIG. 8B shows a change in the gate voltage of an unselected row.

The gate voltage of a selected row changes as shown in FIG. 8A. During the charge accumulation operation, the gate voltage is $V_0$. The gate voltage is changed to $V_1$ in period T1, and the S signal is read.

In period T2, the gate voltage is changed to $V_2$, which is high, and the reset operation is performed. In period T3, the gate voltage is returned to $V_1$, and the N signal is read. Such a series of operations are performed in each imaging cycle.

In an unselected row (FIG. 8B), the gate voltage is $V_0$, and charges are accumulated in the carrier pocket region 20.

The above-described threshold voltage modulation system MOS image sensor has a problem in that when a potential barrier $\Delta\phi_{RST}$ related to the transfer of the charges (holes) from the carrier pocket region 20 to the substrate 13 exists during the reset operation, the charges partially remain in the carrier pocket region 20 (the amount of the remaining charges is represented by $\Delta Q$).

FIG. 7 shows gate voltage $V_2$ during the reset operation and gate voltage $V_2'$ which is lower than $V_2$. As represented by the comparison of these two voltages, the potential barrier $\Delta\phi_{RST}$ and the remaining charge amount $\Delta Q$ rely on the gate voltage. A value of each of the potential barrier $\Delta\phi_{RST}$ and the remaining charge amount $\Delta Q$ decreases as the gate voltage increases and approaches the high voltage $V_2$.

Figure 9:
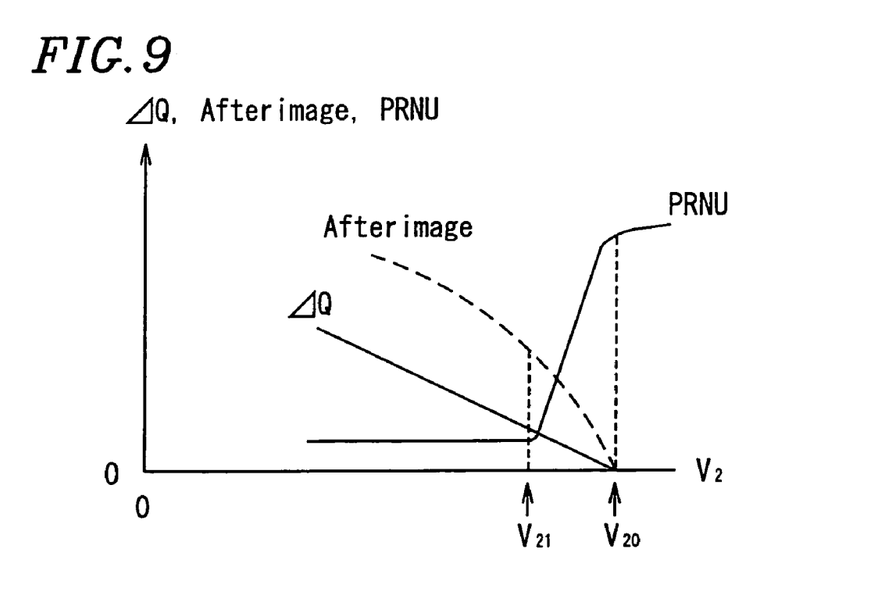
FIG. 9 shows the relationship between the amount of charges remaining in the carrier pocket region and the level of afterimage, and the relationship between the amount of charges and the sensitivity variance, of the solid-state imaging device shown in FIG. 6A.

When the remaining charge amount $\Delta Q$ increases due to the existence of the potential barrier $\Delta\phi_{RST}$ increases the level of afterimage in an image. FIG. 9 shows the relationship between the remaining charge amount $\Delta Q$ and the level of afterimage.

As shown in FIG. 9, the remaining charge amount $\Delta Q$ in the carrier pocket region 20 is 0 when the gate voltage is $V_{20}$ or higher. Therefore, the level of afterimage increases as the gate voltage decreases from $V_{20}$, but no afterimage is generated when the gate voltage is $V_{20}$ or higher.

It is experientially or experimentally known in the field of threshold voltage modulation type MOS image sensors that sensitivity variance (PRNU) among a plurality of unit pixel sections 10 increases when the remaining charge amount $\Delta Q$ decreases.

As shown in FIG. 9, when the gate voltage $V_2$ during the reset operation becomes $V_{21}$ (lower than $V_{20}$ at or higher than which no afterimage is generated) or higher, the sensitivity variance (PRNU) rapidly increases.

SUMMARY OF THE INVENTION

According to one aspect of the invention, a solid-state imaging device includes at least one pixel section; and a control section for controlling an operation of the at least one pixel section. The at least one pixel section includes a light receiving section for outputting charges by performing photo-electric conversion of light incident thereon, and a transistor section having a charge accumulation region for accumulating the charges output by the light receiving section. The transistor section outputs an output signal representing a voltage value corresponding to an amount of charges accumulated in the charge accumulation region. The control section, for resetting the charges accumulated in the charge accumulation region after the output signal is output from the transistor section, injects charges into the charge accumulation region before discharging the accumulated charges from the charge accumulation region.

In one embodiment of the invention, the solid-state imaging device further includes a substrate. The transistor section further includes a gate electrode, a source electrode, and a drain electrode. The control section injects the charges into the charge accumulation region from the substrate by applying a first gate voltage to the gate electrode.

In one embodiment of the invention, the control section discharges the accumulated charges from the charge accumulation region by applying a second gate voltage to the gate electrode. The second gate voltage has a value which causes a prescribed amount of charges to remain in the charge accumulation region.

In one embodiment of the invention, the control section accumulates the charges output from the light receiving section in the charge accumulation region by applying a third gate voltage to the gate electrode.

In one embodiment of the invention, the control section outputs the output signal from the transistor section by applying a fourth gate voltage to the gate electrode.

In one embodiment of the invention, a value of a potential barrier between the substrate and the charge accumulation region when the first gate voltage is applied to the gate electrode is smaller than a value of the potential barrier between the substrate and the charge accumulation region when the third gate voltage is applied to the gate electrode.

In one embodiment of the invention, a value of the second gate voltage is obtained by shifting a gate voltage value necessary to completely discharge the charges accumulated in the charge accumulation region in a direction causing the prescribed amount of charges to remain in the charge accumulation region.

In one embodiment of the invention, the solid-state imaging device includes a plurality of pixel sections which are arranged in a matrix.

In one embodiment of the invention, the solid-state imaging device includes a plurality of pixel sections. The control section applies the third gate voltage to a gate electrode included in at least one unselected pixel section among the plurality of pixel sections. A value of the third gate voltage prevents charges from being injected from the substrate into the charge accumulation region.

In one embodiment of the invention, the at least one pixel section further includes a substrate including a well region. The transistor section includes an annular gate electrode, a source electrode surrounded by the gate electrode, a drain electrode surrounding the gate electrode, and a channel region provided at a position which is in the well region and below the gate electrode. The charge accumulation region is provided at a position which is in the well region and below the channel region, so as to surround the source electrode. The transistor section is connected to the light receiving section via the well region.

According to another aspect of the invention, a method for driving a solid-state imaging device is provided. The solid-state imaging device includes at least one pixel section; and a control section for controlling an operation of the at least one pixel section. The at least one pixel section includes a light receiving section for outputting charges by performing photo-electric conversion of light incident thereon, and a transistor section having a charge accumulation region for accumulating the charges output by the light receiving section. The method includes the steps of outputting an output signal from the transistor section, the output signal representing a voltage value corresponding to an amount of charges accumulated in the charge accumulation region, and for resetting the charges accumulated in the charge accumulation region after the output signal is output from the transistor section, injecting charges into the charge accumulation region before discharging the accumulated charges from the charge accumulation region.

In one embodiment of the invention, the at least one pixel includes a substrate, and the transistor section further includes a gate electrode, a source electrode, and a drain electrode. The step of injecting includes the step of injecting charges from the substrate into the charge accumulation region by applying a first gate voltage to the gate electrode.

In one embodiment of the invention, the method further includes the step of discharging the accumulated charges from the charge accumulation region by applying a second gate voltage to the gate electrode. The second gate voltage has a value which causes a prescribed amount of charges to remain in the charge accumulation region.

In one embodiment of the invention, the method further includes the step of accumulating the charges output from the light receiving section in the charge accumulation region by applying a third gate voltage to the gate electrode.

In one embodiment of the invention, the step of outputting the output signal includes the step of applying a fourth gate voltage to the gate electrode.

The present invention provides the following functions due to the above-described structure.

According to the present invention, for resetting the charges accumulated in the charge accumulation region after the output signal is output from the transistor section, charges are injected into the charge accumulation region before the accumulated charges are discharged from the charge accumulation region. Then, the charges are discharged toward the substrate in the state where a prescribed amount of charges remain in the charge accumulation region. Therefore, a constant amount of charges remain in the charge accumulation region regardless of the amount of charges accumulated during the charge accumulation period (i.e., regardless of the amount of incident light). Thus, no afterimage is generated. Since a constant amount of charges remain in the charge accumulation region, the sensitivity variance (PRNU) can be kept at a low, stable level.

Since the control section controls voltages in the transistor section, such as the gate voltage, it becomes easy to control the charge injection operation from the substrate into the charge accumulation region and the discharge operation with a constant, small amount of charges remaining in the charge accumulation region. The control section controls the gate voltages of a selected row and the gate voltages of an unselected row separately. Thus, it is made possible to sequentially perform the charge injection operation and the discharge operation for each selected row.

Thus, the invention described herein makes possible the advantages of providing a solid-state imaging device and a method for driving the same for providing a high quality image by suppressing generation of an afterimage in an image and suppressing sensitivity variance among pixel sections.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1A:
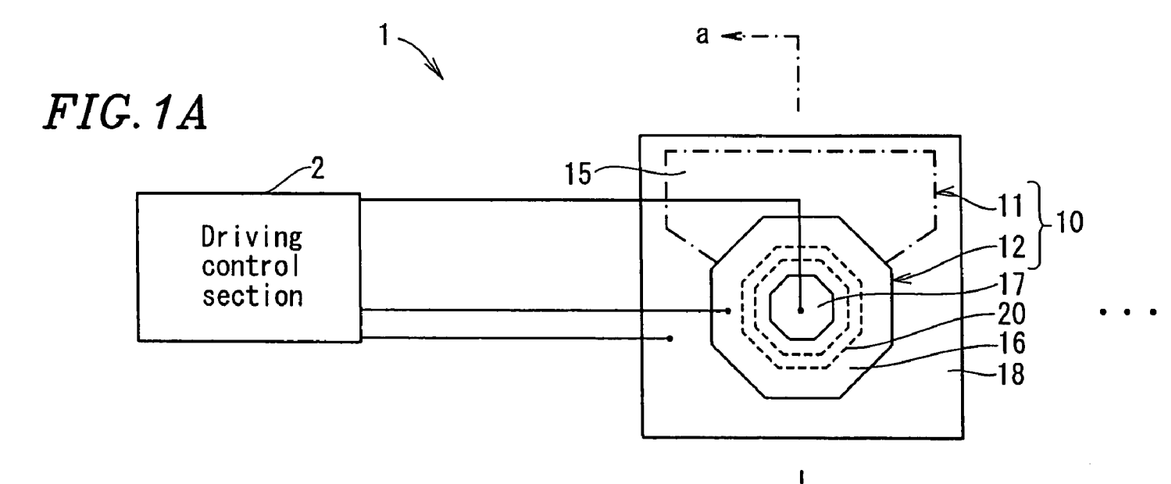
FIG. 1A is a block diagram of a solid-state imaging device according to one example of the present invention.

FIG. 1A is a block diagram illustrating a part of a solid-state imaging device 1 according to one example of the present invention. In this example, the solid-state imaging device 1 is a threshold voltage modulation system MOS image sensor.

The solid-state imaging device 1 includes at least one unit pixel section 10 and a driving control section 2 for controlling the operations of the unit pixel section 10. The unit pixel section 10 includes a substrate 13, a light receiving diode 11 for performing photo-electric conversion of light incident thereon to generate charges in an amount corresponding to the amount of incident light, and a MOS transistor 12. The MOS transistor 12 includes a carrier pocket region 20 acting as a charge accumulation region for accumulating charges output from the light receiving diode 11. The MOS transistor 12 outputs an output signal (imaging signal) representing a voltage value corresponding to the amount of charges accumulated in the carrier pocket region 20. The driving control section 2, for resetting the charges accumulated in the charge accumulation region 20 after the output signal is output from the MOS transistor 12, injects charges into the carrier pocket region 20 before discharging the charges accumulated in the carrier pocket region 20. The carrier pocket region 20 is a P-type hole pocket region in this example.

The solid-state imaging device 1 shown in FIG. 1A includes a plurality of unit pixel sections 10. The plurality of unit pixel sections 10 are provided, for example, in a matrix. The driving control section 2 separately controls the control voltages of the unit pixel section 10 of a selected row and the control voltages of the unit pixel section 10 of an unselected row. The control voltages are a gate voltage, a source voltage and a drain voltage described below. Thus, the driving control section 2 sequentially reads imaging signals from the unit pixel sections 10 of the selected row through a selected column.

Figure 1B:
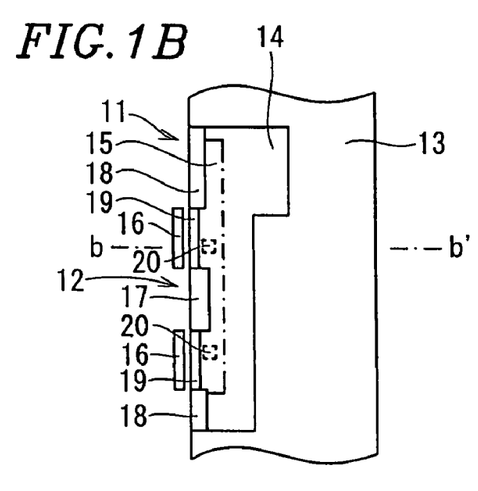
FIG. 1B is a cross-sectional view of a unit pixel section included in the solid-state imaging device shown in FIG. 1A.

FIG. 1A shows only one unit pixel section 10 for the sake of simplicity but the solid-state imaging device 1 includes the number of unit pixel sections 10 corresponding to the number of pixels. FIG. 1B is a cross-sectional view of the unit pixel section 10 taken along line a–a' in FIG. 1A. In FIGS. 1A and 1B, identical elements previously discussed with respect to FIGS. 6A and 6B bear identical reference numerals thereto and the detailed descriptions thereof will be omitted.

As described above, the unit pixel section 10 includes the light receiving diode 11 acting as a light receiving section and a MOS transistor 12 acting as a transistor section for detecting a signal corresponding to the amount of the incident light. The MOS transistor 12 is provided adjacent to the light receiving diode 11.

The light receiving diode 11 includes an N-type well region 14 formed in a surface region of a P-type substrate 13, and a P-type well region 15 formed on the N-type well region 14. An area of the P-type well region 15, which is in the light receiving diode 11, acts as a light receiving region and generates charges (holes) corresponding to the amount of light incident thereon.

The MOS transistor 12 includes an annular gate electrode 16, an N-type source region 17 surrounded by the gate electrode 16, an N-type drain region 18 surrounding the gate electrode 16, an N-type layer 19 acting as a transistor channel region provided at a position which is in the P-type well region 15 and right below the gate electrode 16, and a P-type carrier pocket region 20. The P-type carrier pocket region 20 is provided at a position which is in the P-type well region 15, below the gate electrode 16 and the N-type layer 19, and in the vicinity of the source region 17. The carrier pocket region 20 is provided to surround the source region 17 and acts as a charge accumulation region. The MOS transistor 12 is connected to the light receiving diode 11 via the P-type well region 15. The source region 17 acts as a source electrode, and the drain region 18 acts as a drain electrode.

The driving control section 2 controls the voltages of the gate electrode 16, the source electrode 17 and the drain electrode 18 in order to control the charge accumulation operation, the signal read operation, and the reset operation.

For the reset operation, the driving control section 2 applies a gate voltage having a value, capable of injecting charges into the carrier pocket region 20 from the substrate 13, to the gate electrode 16. Then, when discharging the accumulated charges from the carrier pocket region 20 toward the substrate 13, the driving control section 2 applies a gate voltage having a value, capable of causing a prescribed, constant amount of charges to remain in the carrier pocket region 20, to the gate electrode 16. Thus, the sensitivity variance among the plurality of unit pixel sections 10 can be at a low, stable level.

The operation of the solid-state imaging device 1 will be described with reference to FIGS. 2A, 2B, 3A and 3B.

Figure 2A:
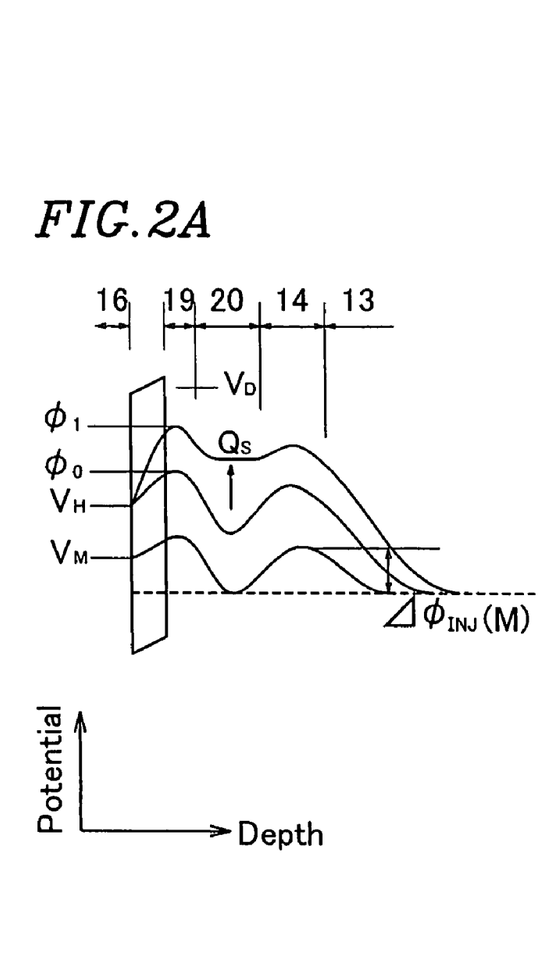
FIGS. 2A and 2B show a potential distribution of the unit pixel section included in the solid-state imaging device shown in FIG. 1A.
Figure 2B:
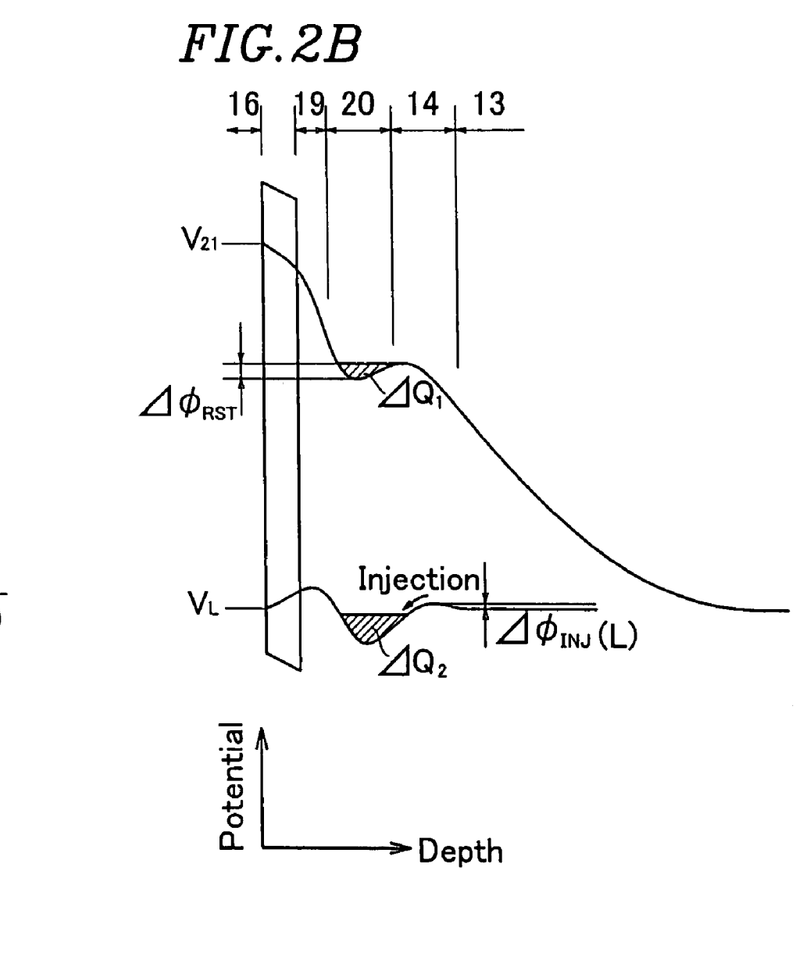

FIGS. 2A and 2B show a potential distribution of the unit pixel section 10 shown in FIGS. 1A and 1B in operation (during an imaging cycle). FIG. 2A shows the potential distribution during the charge accumulation operation and the signal read operation. FIG. 2B shows the potential distribution during the reset operation.

In FIGS. 2A and 2B, the horizontal axis represents the depth of the solid-state imaging device 1 from the surface of a cross-section taken along line b–b' in FIG. 1B. In accordance with the depth, the solid-state imaging device 1 includes the gate electrode 16, the N-type layer 19 as the channel region, the carrier pocket region 20, the N-type well region 14, and the substrate 13. The vertical axis represents the potential in each of the regions of the solid-state imaging device 1 during operations in the imaging cycle.

As shown in FIG. 2A, for the charge accumulation operation, the driving control section 2 sets the potential of the gate electrode 16 to $V_M$ (potential $V_M$ is, for example, equal to potential $V_0$ in FIG. 7), and the charges (holes) generated in the light receiving diode 11 are transferred to the carrier pocket region 20 and accumulated. The concentration profile of each region is set such that the potential barrier $\Delta\phi_{INJ}(M)$ between the substrate 13 and the carrier pocket region 20 related to the transfer of the holes from the substrate 13 to the carrier pocket region 20 during the charge accumulation operation (when the gate potential is $V_M$) has a magnitude such that charges are prevented from being injected from the substrate 13 into the carrier pocket region 20.

Next, for the signal read operation, the driving control section 2 sets the potential of the gate electrode 16 to $V_H$ (potential $V_H$ is, for example, equal to potential $V_1$ in FIG. 7), and sets the potential of the drain electrode 18 to $V_D$. Thus, the potential of the N-type layer 19 as the channel region changes in accordance with the amount of the accumulated charges in the carrier pocket region 20. (For example, the potential of the N-type layer 19 becomes $\phi_0$ when the amount of the accumulated charges is 0, and the potential of the N-type layer 19 becomes $\phi_1$ when the amount of the accumulated charges is Qs). Such a change in the potential of the N-type layer 19 is read from the source region 17 as an output signal (hereinafter, referred to as an "S signal") corresponding to the amount of the accumulated charges in the unit pixel section 10.

As shown in FIG. 2B, when the signal read operation is terminated, the driving control section 2 sets the potential of the gate electrode 16 to $V_L$, which is lower than $V_M$. When the potential of the gate electrode 16 is set to $V_L$, the value of the potential barrier between the substrate 13 and the carrier pocket region 20 related to the transfer of the holes from the substrate 13 to the carrier pocket region 20 becomes $\Delta\phi_{INJ}(L)$, which is lower than $\Delta\phi_{INJ}(M)$. This causes the holes (i.e., charges) to be injected from the substrate 13 into the carrier pocket region 20. The injected amount of charges at this point is $\Delta Q_2$.

Next, the driving control section 2 sets the potential of the gate electrode 16 to potential $V_{21}$, which is lower than the potential $V_{20}$ (FIG. 4), and discharges the charges accumulated in the carrier pocket region 20 toward the substrate 13.

At or higher than $V_{20}$, no afterimage is generated as described above. The value of the potential $V_{21}$ is obtained by shifting the potential $V_{20}$ required to completely discharge the accumulated charges from the carrier pocket region 20 in a direction causing a prescribed amount of charges to remain in the carrier pocket region 20. The potential barrier $\Delta\phi_{RST}$ between the carrier pocket region 20 and the substrate 13 related to the transfer of the charges (holes) from the carrier pocket region 20 to the substrate 13 is set to a magnitude at which charges in a prescribed charge amount $\Delta Q_1$ are allowed to remain in the carrier pocket region 20 when the potential of the gate electrode 16 is $V_{21}$. The prescribed charge amount $\Delta Q_1$ is smaller than the injected charge amount $\Delta Q_2$.

After the above-described reset operation, the driving control section 2 again sets the potential of the gate electrode 16 to $V_M$ in the state where the charges remain in the carrier pocket region 20 in an amount of $\Delta Q_1$, and reads the pixel reference signal (hereinafter, referred to as an "N signal") from the source electrode 17. After the N signal is read, the operation of the MOS image sensor is returned to the charge accumulation operation. Then, the next imaging cycle is performed. The imaging cycle is repeated in this manner.

The concentration profile of each region is set such that the potential barrier $\Delta\phi_{INJ}(L)$ at the gate voltage $V_L$, the potential barrier $\Delta\phi_{INJ}(M)$ at the gate voltage $V_M$, and the potential barrier $\Delta\phi_{RST}$ at the gate voltage $V_{21}$ fulfill the above conditions.

Figure 3A:
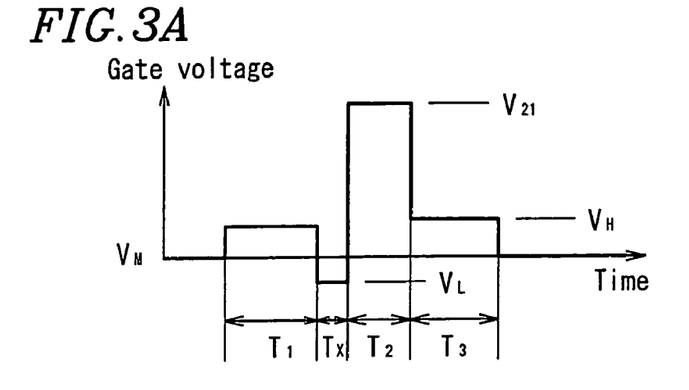
FIGS. 3A and 3B are timing diagrams illustrating the gate voltage in the solid-state imaging device shown in FIG. 1A.
Figure 3B:
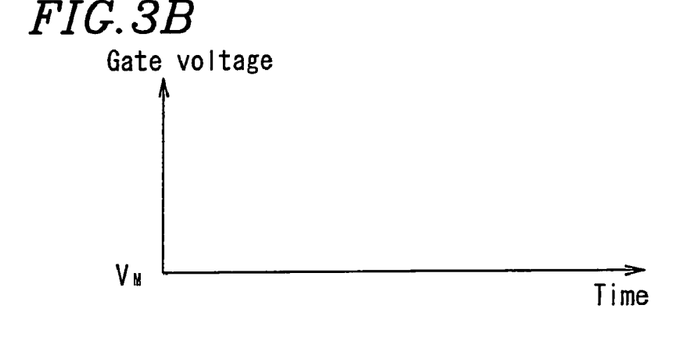

FIGS. 3A and 3B are timing diagrams illustrating the gate voltage of each operation (charge accumulation operation, signal read operation, and reset operation) during the imaging cycle. FIG. 3A shows a change in the gate voltage of a selected row, and FIG. 3B shows a change in the gate voltage of an unselected row. The driving control section 2 sets the voltage of the gate electrode 16 included in at least one unselected pixel section 10 to $V_M$.

As shown in FIG. 3A, in period T1, the gate voltage is set to $V_H$, and the S signal is read. Next, in period Tx, the gate voltage is set to $V_L$, and holes are injected into the carrier pocket region 20 from the substrate 13. In period T2, the gate voltage is set to $V_{21}$, and the reset operation for causing the charges in an amount of $\Delta Q_1$ to remain in the carrier pocket region 20 is performed. Then, in period T3, the gate voltage is again set to $V_H$ and the N signal is read. Such a series of operations are repeated for each imaging cycle.

In this example, for the resetting operation, charges are first injected from the substrate 13 into the carrier pocket region 20, and then charges are discharged toward the substrate 13 while causing a prescribed constant amount of charges to remain in the carrier pocket region 20. Therefore, a prescribed constant amount of charges remain in the carrier pocket region 20 regardless of the amount of the charges accumulated during the charge accumulation period (i.e., regardless of the amount of incident light). Therefore, no afterimage is generated. Since a prescribed constant amount of charges remain in the carrier pocket region 20, the sensitivity variance (PRNU) can be lowered.

Figure 10A:
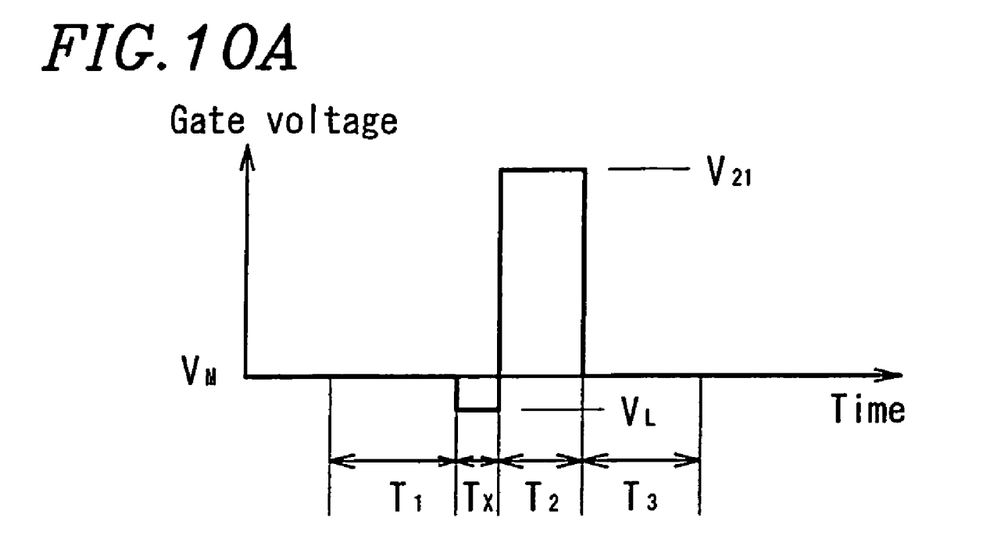
FIGS. 10A and 10B are timing diagrams illustrating the gate voltage in the solid-state imaging device shown in FIG. 1A when applied to a shutter operation.
Figure 10B:
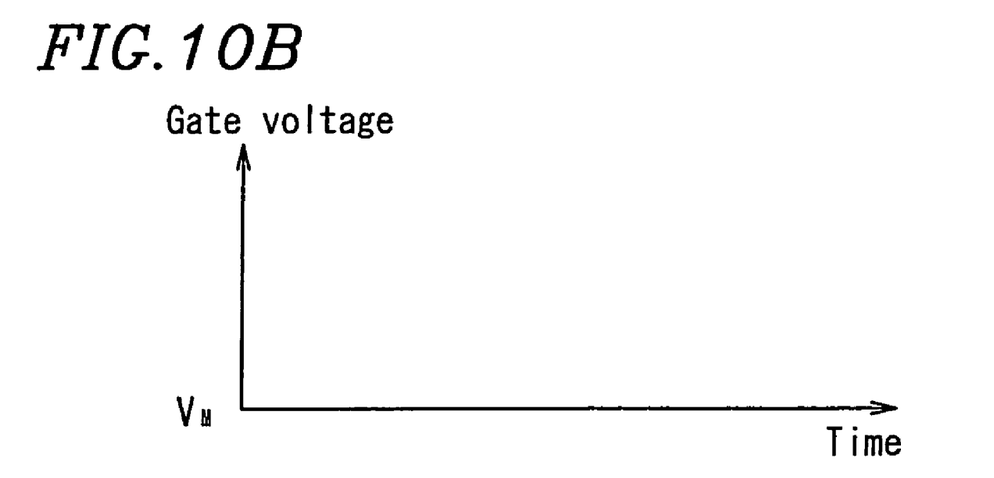

FIGS. 3A and 3B show an example of performing a reset operation after the S signal is read. During a shutter operation, only the reset operation is performed without reading any signal. For a reset operation in such a case, charges are injected. FIGS. 10A and 10B are timing diagrams illustrating the gate voltage in the case where the present invention is applied to the shutter operation. FIG. 10A shows a change in the gate voltage of a selected row, and FIG. 10B shows a change in the gate voltage of an unselected row. As shown in FIG. 10A, in a preceding period including period T1, the gate voltage is set to $V_M$. Then, the gate is set to $V_L$ in period Tx, and holes are injected into the carrier pocket region 20 from the substrate 13. Next, the gate voltage is set to $V_{21}$ in period T2, and the reset operation for causing charges in an amount of $\Delta Q_1$ to remain in the carrier pocket region 20 is performed. Then, the gate voltage is set to $V_M$ in a succeeding period including period T3. For performing the shutter operation, the operation shown in FIG. 10A is inserted into the imaging cycle shown in FIG. 3A.

Figure 4:
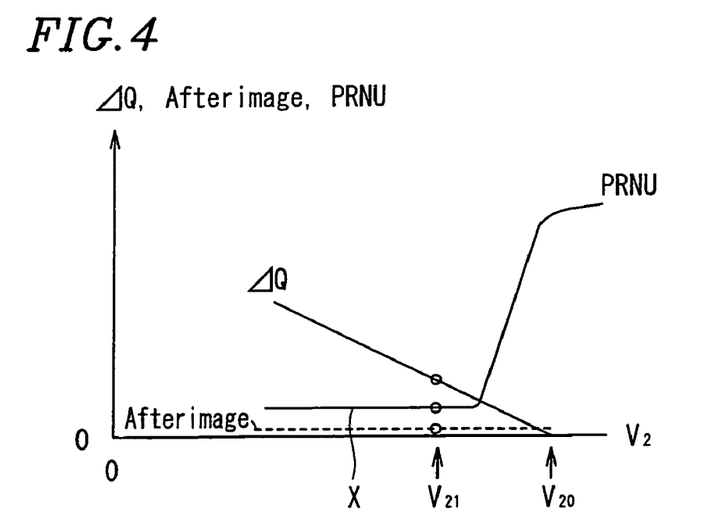
FIG. 4 shows the relationship between the amount of charges remaining in the carrier pocket region and the level of afterimage, and the relationship between the amount of charges and the sensitivity variance, of the solid-state imaging device 1 shown in FIG. 1A.

FIG. 4 shows the relationship between the amount of charges $\Delta Q$ remaining in the carrier pocket region 20 and the level of afterimage, and the relationship between the amount of charges $\Delta Q$ and the sensitivity variance (PRNU), of the solid-state imaging device 1 according to the present invention.

As shown in FIG. 4, when the gate voltage during the reset operation is $V_{21}$ or in the vicinity thereof, a constant level of remaining charges $\Delta Q$ exist in each of the plurality of unit pixel sections 10. Therefore, the sensitivity variance (PRNU) can be kept at a low level (low, stable level X) without generating any afterimage. Therefore, the solid-state imaging device 1 according to the present invention can provide a high quality image.

Figure 5:
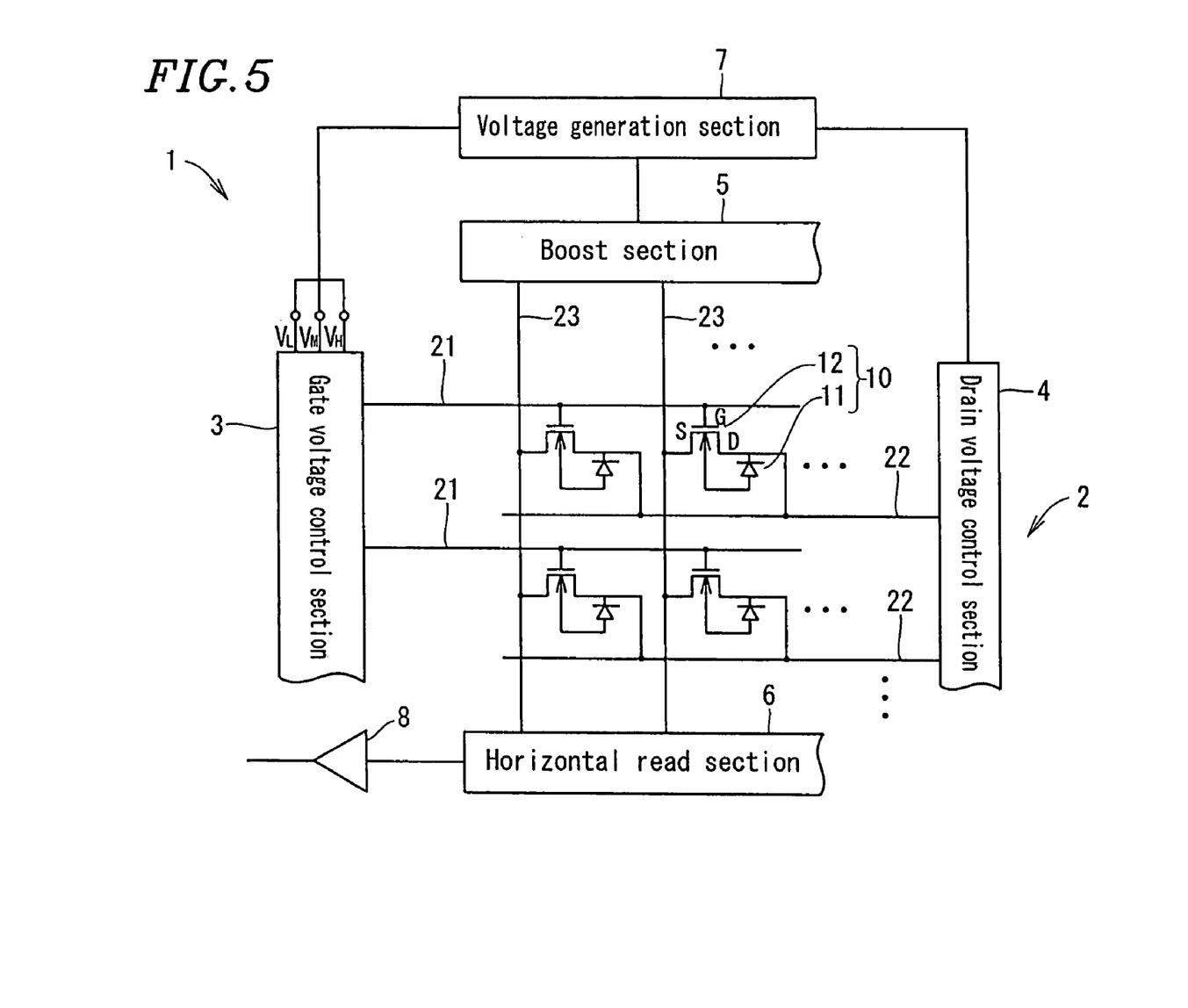
FIG. 5 is a block diagram illustrating the solid-state imaging device 1 shown in FIG. 1A in more detail.

FIG. 5 shows the solid-state imaging device 1 according to the present invention in more detail. In the example shown in FIG. 5, the solid-state imaging device 1 includes a 2 pixel×2 pixel circuit configuration for imaging a two-dimensional image. FIG. 5 shows the 2 pixel×2 pixel circuit configuration for the sake of simplicity, but the present invention is not limited to such a structure. The solid-state imaging device 1 includes the number of unit pixel sections 10 corresponding to the number of pixels.

In the solid-state imaging device 1 shown in FIG. 5, a plurality of (four in FIG. 5) unit pixel sections 10 are arranged in a matrix, i.e., in rows and columns. In each unit pixel section 10, the gate electrode 12 (G) of the MOS transistor 12 is connected to a gate voltage control section 3 via a gate line 21. The drain electrode 18 (D) (FIG. 1B) is connected to a drain voltage control section 4 (drain driving circuit) via a drain line 22. The gate voltage control section 3, the drain voltage control section 4, and a boost section 5 are connected to a voltage generation section 7 for generating a driving pulse and a driving voltage necessary to realize each of the above-described operations. The source electrode 17 (S) is connected to the boost section 5 (boost circuit) and a horizontal read section 6 (horizontal read circuit) via a source line 23. The horizontal read section 6 is connected to an output circuit 8. The gate voltage control section 3, the drain voltage control section 4, the boost section 5, the voltage generation section 7, the horizontal read section 6, and the output circuit 8 are included in the driving control section 2 (FIG. 1). The charge accumulation operation, the signal read operation, and the reset operation are controlled by respective control voltages supplied from the gate voltage control section 3, the drain voltage control section 4, and the boost section 5.

In the solid-state imaging device 1 shown in FIG. 5, for selecting an initial gate line 21 by the gate voltage control section 3, gate voltages having a driving waveform shown in FIG. 3A (first through fourth gate voltages $V_L$, $V_{21}$, $V_M$ and $V_H$) are applied to the gate line 21 to be selected by the gate voltage control section 3. The other gate lines 21 are placed into an unselected state, and a gate voltage having a driving waveform shown in FIG. 3B (gate voltage $V_M$) is applied to the unselected gate lines 21 by the gate voltage control section 3.

In the plurality of unit pixel sections 10 which are connected to the selected gate line 21 (unit pixel sections 10 in a selected row), a series of operations of: charge accumulation (third gate voltage $V_M$) to signal read of the S signal (fourth gate voltage $V_H$) to hole injection (first gate voltage $V_L$) to reset with the charges partially remaining (second gate voltage $V_{21}$) to signal read of the N signal (fourth gate voltage $V_H$) are sequentially performed. In the plurality of unit pixel sections 10 connected to the unselected gate lines 21 (unit pixel sections 10 in an unselected selected row), the charge accumulation operation (third gate voltage $V_M$) is performed. The voltage application to the source electrode 17 during the reset operation is performed by the boost section 5 via the source line 23.

The imaging signal (S signal) which is read via the source line 23 during the signal read operation is output to an output terminal via the horizontal read section 6 and the output circuit 8.

In the solid-state imaging device 1 in this example, the gate voltages of a selected row and the gate voltages of an unselected row are separately controlled. This makes it easy to control only the selected row regarding the charge injection from the substrate 13 into the carrier pocket region (charge accumulation region) 20 and the reset operation for causing a constant, small amount of charges to remain in the carrier pocket region 20. Since a constant amount of charges remain in each carrier pocket region 20, (i) no afterimage is generated and (ii) the sensitivity variance (PRNU) among the plurality of unit pixel sections 10 can be lowered.

In the solid-state imaging device 1 in this example, the reset operation is performed by injecting charges into only the pixel sections to be reset (which may be all the pixel portions) and then applying a voltage for discharging the charges. Thus, generation of an afterimage and sensitivity variance can be suppressed. Since the charges are injected into target pixel sections during the reset operation, excessive discharging is prevented and thus generation of an afterimage can be prevented. The value of the voltage for discharging the charges may be set to a level at which the sensitivity variance is low.

The gate voltage changes, for example, as shown in FIGS. 3A and 3B. The source voltage and the drain voltage fundamentally change as in the conventional solid-state imaging device. The source voltage and the drain voltage may be controlled in various manners. For example, Japanese Laid-Open Publication No. 2001-196570 discloses a method for applying a high voltage to the source electrode so as to increase the gate voltage, but many other methods including this method may be used for the present invention.

When the polarity of the elements included in the unit pixel section 10 is inverted, the level relationship of the voltages is also inverted. For example, the polarity of the elements is inverted, the level relationship of $V_{21}$ and $V_{20}$ is inverted from $V_{21}<V_{20}$ to $V_{21}>V_{20}$.

According to the present invention, the reset operation is performed by first injecting charges into the charge accumulation region from the substrate, and then discharging the accumulated charges from the charge accumulation region toward the substrate while causing a prescribed amount of charges to remain in the charge accumulation region. Therefore, a constant amount of charges remain in the charge accumulation region regardless of the amount of charges accumulated during the charge accumulation period (i.e., regardless of the amount of incident light). Thus, no afterimage is generated. Since a constant amount of charges remain in the charge accumulation region, the sensitivity variance (PRNU) can be kept at a low, stable level. Therefore, the solid-state imaging device according to the present invention provides a high quality image.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state imaging device, comprising:
   at least one pixel section; and
   a control section for controlling operation of the at least one pixel section;
   wherein the at least one pixel section includes:
      a light receiving section for outputting charges by performing photo-electric conversion of light incident thereon, and
      a transistor section having a charge accumulation region for accumulating the charges output by the light receiving section, where the transistor section outputs an output signal representing a voltage value corresponding to an amount of charges accumulated in the charge accumulation region; and
   wherein the control section controls the resetting operation of the at least one pixel section, for resetting the charges accumulated in the charge accumulation region after the output signal is output from the transistor section, including causing charges to be injected into the charge accumulation region before discharging the accumulated charges from the charge accumulation region.

2. A solid-state imaging device according to claim 1, further comprising a substrate, wherein:
   the transistor section further includes a gate electrode, a source electrode, and a drain electrode; and
   the control section causes the charges to be injected into the charge accumulation region from the substrate by applying a first gate voltage to the gate electrode.

3. A solid-state imaging device according to claim 2, wherein:
   the control section controls the resetting operation of the at least one pixel section including controlling discharging of charges from the charge accumulation region after said injecting charges therein and such that a prescribed amount of charges remain in the charge accumulation region following the discharging operation.

4. A solid-state imaging device according to claim 3, wherein the control section controls discharging of charges from the charge accumulation region by causing a second gate voltage to be applied to the gate electrode, where the second gate voltage is set so that following said discharging of charges the prescribed amount of charges remains in the charge accumulation region.

5. A solid-state imaging device according to claim 4, wherein the second gate voltage is obtained by shifting a gate voltage value necessary to completely discharge the charges accumulated in the charge accumulation region in a direction causing the prescribed amount of charges to remain in the charge accumulation region.

6. A solid-state imaging device according to claim 3, wherein the charges being injected into the charge accumulation region are not charges from the photo-electric conversion process performed in the light receiving section.

7. A solid-state imaging device according to claim 2, wherein the control section controls a charge accumulating operation of the at least one pixel section for accumulating the charges output from the light receiving section in the charge accumulation region by causing a third gate voltage to be applied to the gate electrode.

8. A solid-state imaging device according to claim 7, wherein the first gate voltage being applied to the gate electrode is set so a value of a potential barrier between the substrate and the charge accumulation region is smaller than a value of the potential barrier between the substrate and the charge accumulation region when the third gate voltage is applied to the gate electrode.

9. A solid-state imaging device according to claim 7, further including a plurality of pixel sections, wherein:
the control section causes the third gate voltage to be applied to a gate electrode included in at least one unselected pixel section among the plurality of pixel sections, and
where the third gate voltage be applied is set so as to prevent charges from being injected from the substrate into the charge accumulation region.

10. A solid-state imaging device according to claim 2, wherein the control section controls outputting of the output signal from the transistor section by causing a fourth gate voltage to be applied to the gate electrode.

11. A solid-state imaging device according to claim 1, including a plurality of pixel sections which are arranged in a matrix.

12. A solid-state imaging device according to claim 1, wherein:
the at least one pixel section further includes a substrate including a well region;
the transistor section includes:
an annular gate electrode,
a source electrode surrounded by the gate electrode,
a drain electrode surrounding the gate electrode, and
a channel region provided at a position which is in the well region and below the gate electrode;
the charge accumulation region is provided at a position which is in the well region and below the channel region, so as to surround the source electrode, and
the transistor section is connected to the light receiving section via the well region.

13. A solid-state imaging device, comprising:
at least one pixel section;
a control section for controlling operation of the at least one pixel section;
wherein the at least one pixel section includes:
a light receiving section for outputting charges by performing photo-electric conversion of light incident thereon, and
a transistor section having a charge accumulation region for accumulating the charges output by the light receiving section, where the transistor section outputs an output signal representing a voltage value corresponding to an amount of charges accumulated in the charge accumulation region; and
wherein the control section is arranged to control the resetting operation of the at least one pixel section for resetting the charges accumulated in the charge accumulation region after the output signal is output from the transistor section,
wherein said controlling of the resetting operation includes controlling a charge injection operation and a charge discharging operation, where charges unrelated to the photo-electric conversion process are injected into the charge accumulation region in the charge injection operation before the discharging operation and in the discharging operation charges are discharged from the charge accumulation region such that a prescribed amount of charges remain in the charge accumulation region following the discharging operation.

14. A solid-state imaging device according to claim 13, further including a substrate and wherein:
the transistor section further includes a gate electrode; and
the control section is arranged to control operation of the at least one pixel section by controlling voltage(s) being applied to the gate electrode.

15. A solid-state imaging device according to claim 14, wherein the control section controls the voltage(s) being applied to the gate electrode during the charge injection operation so that a first gate voltage is applied to the gate electrode, the first gate voltage having a value set so that charges are injected into the charge accumulation region from the substrate.

16. A solid-state imaging device according to claim 14, wherein the control section controls the voltage(s) being applied to the gate electrode during the charge discharging operation so that a second gate voltage is applied to the gate electrode, the second gate voltage having a value set so that the prescribed amount of charges remain in the charge accumulation region following the discharging operation.

17. A solid-state imaging device according to claim 16, wherein the value of the second gate voltage is obtained by shifting a gate voltage value necessary to completely discharge the charges accumulated in the charge accumulation region in a direction that causes the prescribed amount of charges to remain in the charge accumulation region.

18. A solid-state imaging device according to claim 14, wherein the control section controls the voltage(s) being applied to the gate electrode during a charge accumulation operation, during which charges output from the light receiving section are accumulated in the charge accumulation region, so that a third gate voltage is applied to the gate electrode so that charges are injected into the charge accumulation region from the substrate.

19. A solid-state imaging device according to claim 18, wherein the first gate voltage being applied to the gate electrode is set so a value of a potential barrier between the substrate and the charge accumulation region is smaller than a value of the potential barrier between the substrate and the charge accumulation region when the third gate voltage is applied to the gate electrode.

20. A solid-state imaging device according to claim 18, wherein a value of the third gate voltage is set so the voltage(s) being applied is such as to prevent charges from being injected from the substrate into the charge accumulation region during the charge accumulation operation.

21. A solid-state imaging device according to claim 14, wherein the control section controls the voltage(s) being applied to the gate electrode during a signal outputting operation, during which a signal is output from the transistor section, so that a fourth gate voltage is applied to the gate electrode.

22. A solid-state imaging device according to claim 13 comprising a plurality of pixel sections that are arranged in a matrix.

23. A solid-state imaging device, comprising:
a substrate;
at least one pixel section;
wherein the at least one pixel section includes:
a light receiving section for outputting charges by performing photo-electric conversion of light incident thereon, and
transistor section having a charge accumulation region for accumulating the charges output by the light receiving section and a gate electrode, where the transistor section outputs an output signal representing a voltage value corresponding to an amount of charges accumulated in the charge accumulation region; and a control section arranged for controlling operation of the at least one pixel section by controlling voltage(s) being applied to the gate electrode wherein the control section is arranged to control the resetting operation including a charge injection operation and a charge discharging operation, of the at least one pixel section for resetting the charges accumulated in the charge accumulation region after the output signal is output from the transistor section, wherein the control section controls the voltage(s) being applied to the gate electrode during the charge injection operation so that a first gate voltage is applied to the gate electrode before the charge discharging operation, the first gate voltage having a value set so that charges are injected into the charge accumulation region from the substrate; and wherein the control section controls the voltage(s) being applied to the gate electrode during the charge discharging operation so that a second gate voltage is applied to the gate electrode, the second gate voltage having a value set so that a prescribed amount of charges remain in the charge accumulation region following the discharging operation.

24. A solid-state imaging device according to claim 23, wherein the charges being injected into the charge accumulation region are not charges from the photo-electric conversion process performed in the light receiving section.

25. A solid-state imaging device according to claim 23, wherein the control section controls the voltage(s) being applied to the gate electrode during a charge accumulation operation, during which charges output from the light receiving section are accumulated in the charge accumulation region, so that a third gate voltage is applied to the gate electrode so that charges are injected into the charge accumulation region from the substrate.

26. A solid-state imaging device according to claim 25, wherein the first gate voltage being applied to the gate electrode is set so a value of a potential barrier between the substrate and the charge accumulation region is smaller than a value of the potential barrier between the substrate and the charge accumulation region when the third gate voltage is applied to the gate electrode.

27. A solid-state imaging device according to claim 25, wherein a value of the third gate voltage is set so the voltage(s) being applied is such as to prevent charges from being injected from the substrate into the charge accumulation region during the charge accumulation operation.

28. A solid-state imaging device according to claim 23, wherein the control section controls the voltage(s) being applied to the gate electrode during a signal outputting operation, during which a signal is output from the transistor section, so that a fourth gate voltage is applied to the gate electrode.

29. A solid-state imaging device according to claim 23 comprising a plurality of pixel sections that are arranged in a matrix.

* * * * *